United States Patent
Ku et al.

(10) Patent No.: US 8,330,232 B2
(45) Date of Patent: Dec. 11, 2012

(54) NONVOLATILE MEMORY DEVICE AND METHOD OF FORMING THE SAME

(75) Inventors: Shao Hong Ku, Taipei (TW); Yin Jen Chen, Taipei County (TW); Wenpin Lu, Hsinchu County (TW); Tahui Wang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 680 days.

(21) Appl. No.: 11/209,145

(22) Filed: Aug. 22, 2005

(65) Prior Publication Data

US 2007/0040211 A1  Feb. 22, 2007

(51) Int. Cl.
*H01L 29/02* (2006.01)

(52) U.S. Cl. ........ 257/402; 257/404; 257/324; 257/285; 257/E29.309; 438/217; 438/289; 438/291

(58) Field of Classification Search ............ 257/402, 257/285, 287, 404, E29.309
See application file for complete search history.

(56) References Cited

U.S. PATENT DOCUMENTS

| | | | |
|---|---|---|---|
| 4,307,411 A | 12/1981 | Carnes et al. | |
| 4,467,452 A * | 8/1984 | Saito et al. | 365/184 |
| 5,479,367 A * | 12/1995 | Maurelli et al. | 365/182 |
| 5,739,569 A * | 4/1998 | Chen | 257/321 |
| 6,020,244 A * | 2/2000 | Thompson et al. | 438/302 |
| 6,081,007 A * | 6/2000 | Matsuoka | 257/285 |
| 6,194,293 B1 * | 2/2001 | Krivokapic | 438/525 |
| 6,348,711 B1 | 2/2002 | Eitan | |
| 6,477,084 B1 | 11/2002 | Eitan | |
| 6,538,292 B2 * | 3/2003 | Chang et al. | 257/391 |
| 6,551,880 B1 | 4/2003 | Lai et al. | |
| 6,667,216 B2 * | 12/2003 | Umimoto et al. | 438/329 |
| 6,706,598 B2 | 3/2004 | Lai | |
| 6,768,165 B1 * | 7/2004 | Eitan | 257/324 |
| 6,815,764 B2 | 11/2004 | Bae et al. | |
| 2001/0004541 A1 * | 6/2001 | Richter et al. | 438/289 |
| 2006/0227608 A1 * | 10/2006 | Lusky | 365/185.14 |

FOREIGN PATENT DOCUMENTS

CN  1247632  3/2000

OTHER PUBLICATIONS

Sze, Physics of Semiconductor Devices, 1981, John Wiley & Sons, Inc., 2nd Ed., p. 496-497.*

(Continued)

*Primary Examiner* — Kenneth Parker
*Assistant Examiner* — Jose R Diaz
(74) *Attorney, Agent, or Firm* — Jianq Chyun IP Office

(57) ABSTRACT

A multi-bit memory cell includes a substrate; a multi-bit charge-trapping cell over the substrate, the multi-bit charge-trapping cell having a first lateral side and a second lateral side; a source region in the substrate, a portion of the source region being under the first side of the multi-bit charge-trapping cell; a drain region in the substrate, a portion of the drain region being under the second side of the multi-bit charge-trapping cell; and a channel region in the substrate between the source region and the drain region. The channel region has one of a p-type doping and an n-type doping, and the doping is configured to provide a highest doping concentration near the central portion of the channel region.

17 Claims, 3 Drawing Sheets

OTHER PUBLICATIONS

C.C. Yeh, et al. "Phines: A Novel Low Power Program/Erase, Small Pitch 2-Bit per Cell Flash Memory," IEDM Tech. Dig., 2002, pp. 931-934.

Jun-Wei Wu, et al. "Pocket Implantation Effect on Drain Current Flicker Noise in Analog nMOSFET Devices," IEEE Transactions on Electron Devices, vol. 51, No. 8, Aug. 2004, 1262-1266.

* cited by examiner

US 8,330,232 B2

NONVOLATILE MEMORY DEVICE AND METHOD OF FORMING THE SAME

The present invention relates generally to nonvolatile memory devices. More particularly, the present invention relates to multi-bit cell nonvolatile memories and methods of forming the same.

BACKGROUND OF THE INVENTION

Nonvolatile memory devices may have various structural designs. FIG. 1 depicts an example of a nonvolatile memory cell 10 that is implemented in and on a substrate 8. Memory cell 10 comprises source and drain regions 22, 24 and a channel 12 disposed between the source and drain regions 22, 24. Overlying the channel 12 is a charge-trapping structure 11, which may include a charge-trapping nitride layer 16 (e.g., silicon nitride) disposed between two oxide layers 14, 18 (e.g., silicon oxide). Each memory cell 10 further comprises a gate electrode 20 that overlies the charge-trapping structure 11, and the source and drain regions 22, 24 each have a corresponding electrode, as shown in FIG. 1. By properly manipulating the relative voltages among the substrate 8, the source and drain regions 22, 24 and the gate 20, it is possible to separately erase, store (or program) and read two bits of information (a right bit and a left bit) in each memory cell 10.

However, conventional flash memory cells may have several possible concerns depending on their designs, dimensions, and operating voltages. For example, problems such as lateral charge transportation in the storage element, low-Vt state threshold voltage instability, high-Vt state charge loss, and a second bit effect (cross-talk) and/or a short channel effect may occur. In some cases, lateral charge transportation in the storage element, such as the charge-trapping layer 16 may occur from the left bit to the right bit if the isolation between the two bits is insufficient. For devices having smaller dimensions, short channel effect represents the undesirable effect from the gradual shorting together of the source and drain regions 22, 24 as the gate and channel length shortens.

Another possible problem is the second bit effect. The second-bit effect may be generated during a forward reading when one bit of data is already stored in the trapping layer at one side, such as the side of the drain region. Particularly, the bit of information that is already stored at one side may affect a threshold voltage of the other bit in reverse read and vice versa. Therefore, there is a need to improve the design of memory devices to mitigate or avoid one or more of the aforementioned problems of the conventional devices.

SUMMARY OF THE INVENTION

Briefly stated, the present inventions, in one embodiment comprises a multi-bit memory cell including a substrate; a tunnel layer over the substrate; a charge-trapping layer over the tunnel layer; an insulating layer over the charge-trapping layer; and a gate over on the insulating layer, the gate having a first lateral side and a second lateral side. In addition, the memory cell includes a source region, a drain region, and a channel region in the substrate. A portion of the source region is under the first side of the gate, and a portion of the drain region is under the second side of the gate. The channel region has one of a p-type doping and an n-type doping, and the doping is configured to provide a highest doping concentration near the central portion of the channel region.

In another embodiment, a multi-bit memory cell includes a substrate; a multi-bit charge-trapping cell over the substrate, the multi-bit charge-trapping cell having a first lateral side and a second lateral side; a source region in the substrate, a portion of the source region being under the first side of the multi-bit charge-trapping cell; a drain region in the substrate, a portion of the drain region being under the second side of the multi-bit charge-trapping cell; and a channel region in the substrate between the source region and the drain region. The channel region includes at least three doped regions, including a first doped region located near the central portion of the channel region; a second doped region located near one side of the first doped region; and a third doped region located near the other side of the first doped region. The first doped region has a higher doping concentration than the second doped region and the third doped region.

BRIEF DESCRIPTION WITH SEVERAL VIEWS OF THE DRAWINGS

DETAILED DESCRIPTION OF THE INVENTION

Examples consistent with the present invention may improve charge isolation in a multi-bit flash memory device by varying a doping profile, such as the doping profile of a channel region, in the substrate. For example, the highest doping concentration may be provided near a central portion of a channel region. In some examples, an appropriate doping profile in a channel region may have the effect of electrically separating a charge-trapping layer into two storage parts to reduce or block charge redistribution in a charge-trapping layer of a multi-bit cell memory, such as a twin-bit cell memory. Also, in some examples, providing a lower doping concentration near the source and drain regions may cause insensitivity to the variation in the charge number due to a smaller electric field. Thus, data loss in the program state, erase state, or both, may be improved.

Depending on the device and design of the memory cells, doping profiles illustrated below may extend the depletion layer further towards the channel, thereby improving masking of stored charges and/or reducing the second bit effect. Furthermore, providing certain doping profiles in the channel region may reduce the short channel effect.

Figure 1:
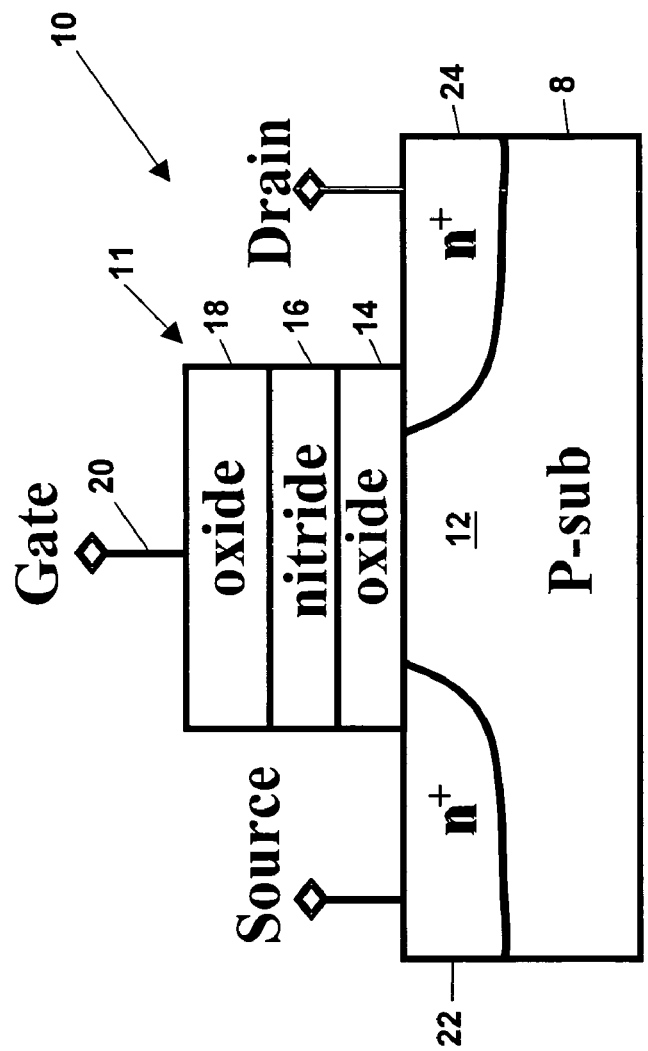
FIG. 1 is a schematic diagram illustrating an exemplary structure of a prior art nonvolatile memory cell.
Figure 2:
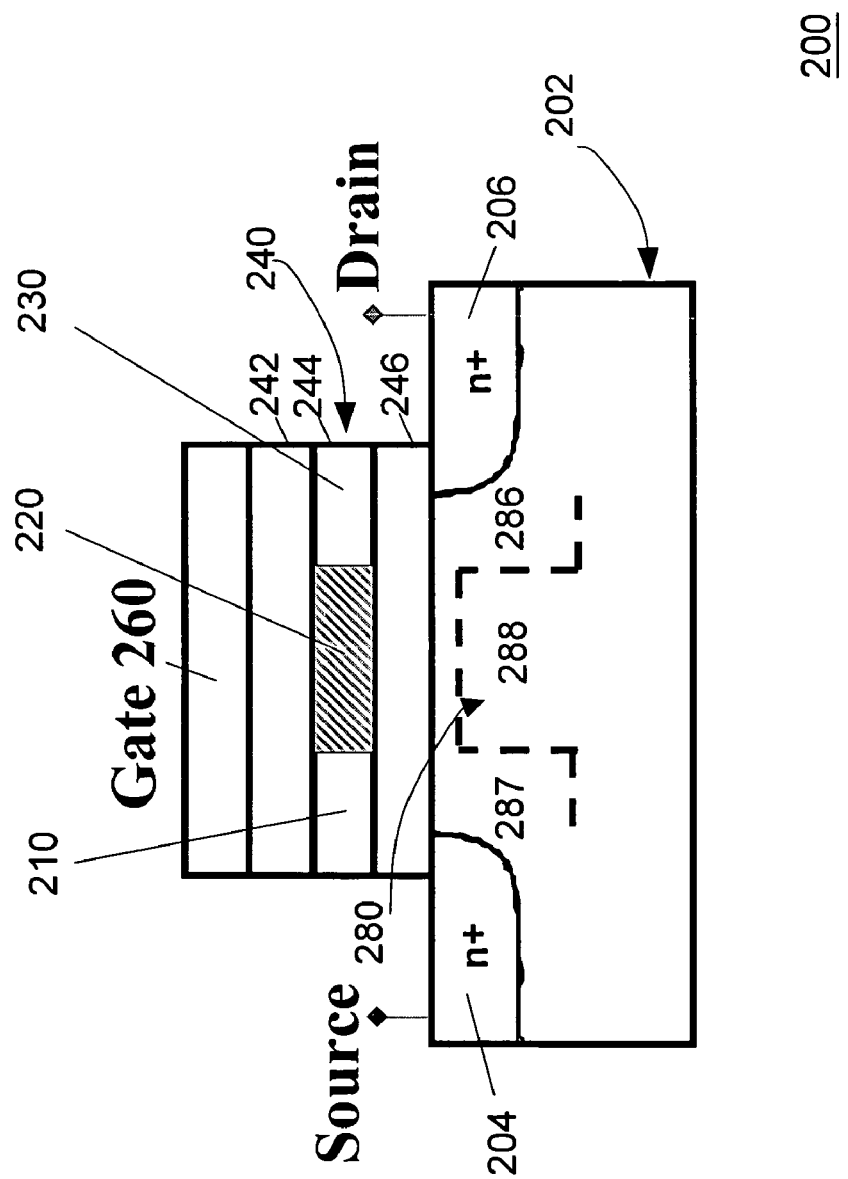
FIG. 2 is a cross-sectional diagram of a multi-bit memory cell according to an a preferred embodiment of the present invention.

FIG. 2 is a cross sectional diagram of a multi-bit memory cell 200 in one embodiment. The multi-bit memory cell 200, such as a twin-bit memory cell, may be formed in and on a substrate 202. In the case of forming p-type devices, including p-type source and drain regions, the substrate 202 may be a p-type substrate with n wells provided for the areas for forming the p-type devices. Alternatively, for forming n-type devices, including n-type source and drain regions, substrate 202 may be an n type substrate with p wells provided for the areas for forming the n-type devices.

Referring to FIG. 2, in the present embodiment the multi-bit memory cell 200 includes source and drain regions 204 and 206 and a channel region 280 disposed between the source and drain regions 204, 206. Overlying at least a portion of the channel region 280 is a charge-trapping cell or structure 240, which may comprise a charge-trapping layer 244 disposed between a tunnel layer 246 and an insulating layer 242. In the present embodiment, the charge-trapping layer 244 may be a silicon nitride layer; the tunnel layer 246 may be a silicon oxide layer; and the insulating layer 242 may be another silicon oxide layer. Other materials may be used. Each memory cell 200 further includes a gate or gate electrode 260 that overlies the insulating layer 242. The source and drain regions 204 and 206 each may have corresponding electrodes or couplings to corresponding bit lines for making appropriate circuitry connections.

An example of a channel region 280 may include several doped regions, such as regions 287, 288, and 286 illustrated in FIG. 2. Region 288 which is located at or near the central portion of the channel region 280 has a higher or the highest doping concentration. In one example, region 288 may have a dose of about $1\times10^{13}$ to about $1\times10^{15}$ atoms·cm$^{-2}$. In one particular example, region 288 may have a dose of about $1\times10^{13}$-$5\times10^{13}$ atoms·cm$^{-2}$. In an example of forming a p-type doped region, boron may be implanted with an energy of about 30-120 KeV using an implantation process. An appropriate mask may be used to shield other areas of the substrate 202 during implantation. Alternatively, the entire substrate 202 may be doped with a p-type implantation process, followed by an n-type implantation process with masks or using charge-trapping cells as masks to counterbalance the p dopants in areas where high p concentration is not needed. Other suitable p-type dopants, including, gallium, may be used to perform the doping.

Figure 3:
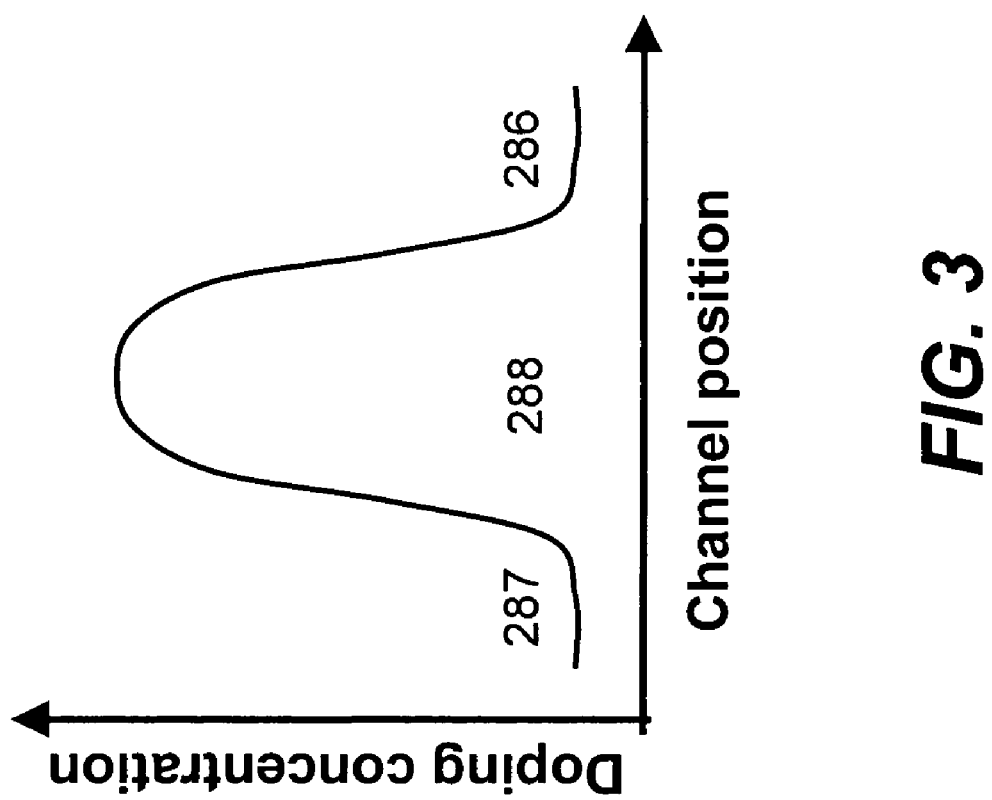
FIG. 3 is a diagram showing doping concentration as a function of a position in a channel region according to the preferred embodiment.

FIG. 3 is a diagram illustration of an exemplary doping profile as a function of channel position. As shown in FIG. 3, the doping concentration may be greatest at or near the central portion 288 of the channel region and become lower at areas away from the central portion 288 or near the source region 204 or drain region 206. In one example, the doping is p-type doping. For example, doping concentration at 288 may be p+ doping, which may be provided by a high concentration of boron, gallium, or other suitable p-type materials. In one example, an implantation process may be used for doping p-type dopants in the central portion 288. The level of p-type doping concentration in the adjacent regions 286 and 287, which respectively are closer to the source and drain regions 204, 206, may be much less or minimal. An exemplar device may have concentrations in the adjacent regions 286, 287 approximate the p-type doping concentration of the well or the substrate 200 itself.

In one example, the doping concentration in regions 286 and 287 may be in the range of about $1\times10^{16}$ cm$^{-3}$ to $1\times10^{17}$ cm$^{-3}$. Alternatively, regions 286 and 287 may be slightly doped with p-type dopants thereby forming p$^-$ regions. Various type of implantation, doping, or diffusing processes may be used for providing the doping profiles noted above. For example, as noted above, an appropriate mask may be used to shield other areas of the substrate 202 to allow the doping of the central portion 288 of a channel region 280.

Alternatively, the entire substrate 202 may be doped with a p-type implantation process, followed by an n-type implantation process with masks or using charge-trapping cells as masks to counterbalance the p dopants in areas where high p concentration is not needed. In a second preferred embodiment of the present invention, a blanket p+ doping is implanted in p-type substrate 202 prior to growing the change trapping cell or structure 240. In one example, boron may be doped with an energy of about 30-120 Kev or at a dose of about 1-$5\times10^{13}$ atoms·cm$^{-2}$ for providing the concentration at the central portion 288. If a blanket implantation process is used, the p+ doping in the adjacent regions 286 and 287 may be neutralized afterward by an n-type implantation with n-type dopants, such as phosphorous.

Furthermore, the doping profile or part of it may be provided by one or more small-angle or large-angle implantation processes performed after a memory cell structure is formed over the substrate 202. For example, n-type or p-type doping in regions such as regions 286 and 287 may occur at a shallow angle after a memory cell structure is formed. For example, phosphorous may be implanted with an energy of about 30-100 Kev at an angle of about 15°-30°. In this manner, the memory cell structure may be used as a mask during the implantation process. In another example, the doping profile of the central region 288 may be provided by a large-angle implantation process. For example, an implantation may occur at about 40°-45° after the formation of the memory cell structure or a portion of it to provide p-type dopants in or near central portion 288. For one exemplary device, boron may be doped with an energy of about 30-120 Kev or for dose of about 1-$5\times10^{13}$ atoms·cm$^{-2}$.

In one example, providing a higher doping concentration in the central portion 288 of a channel region 280 may create a barrier or depletion region 220 in the nitride layer 240. A barrier or depletion region 230 may prevent lateral charge diffusion or redistribution between the two bits, or the two charge-trapping regions 210, 230, of a memory cell 200. In one example, such effect may be caused by the electric field created due to the doping profile noted above. Furthermore, a high doping concentration at or near the central portion 288 of a channel region 280 may act as a barrier in the channel region 280, thereby mitigating the short channel effect.

Also, in one example, providing a low doping concentration in regions 287 and 286 may lessen the electric fields in those regions, particularly the electric fields near the source and drain regions 204 and 206. The example provides a weaker electric field than devices having pocket implantation of as high as $1\times10^{12}$ atoms·cm$^{-2}$ to $1\times10^{14}$ atoms·cm$^{-2}$ in regions near the source and drain regions 204 and 206. Accordingly, the memory device 200 may have a lower sensitivity to a variation in charge during program and erase states, thereby preventing or reducing data loss.

In one example, a memory cell 200 may fabricated by forming and patterning the layers providing the memory cell structure over the substrate 202. For example, referring to FIG. 2, a charge-trapping cell or structure 240 may include a charge-trapping layer 244 disposed between a tunnel layer 246 and an insulating layer 242. As noted above, charge-trapping layer 244 may be a silicon nitride layer; the tunnel layer 246 may be a silicon oxide layer; and insulating layer 242 may be another silicon oxide layer, thereby providing an ONO structure in one example. The layers may be formed by deposition, oxidation, or nitridation techniques or any combination of them. The layers may also be formed separately or jointly. In one example, the thickness for layers 242, 244, and 246 respectively may be about 50-100 Å, about 20-50 Å, and about 50-100 Å.

After providing the charge-trapping layer 244, the tunnel layer 246, and the insulating layer 242, a gate or gate electrode 260 may be formed over the insulating layer 242. In one example, the gate 260 may be a polysilicon gate formed by a deposition process. The polysilicon gate 260 or other conductive structure may be formed as part of word lines of a memory array. In addition, bit lines of a memory array may be formed over the substrate 202 to provide electrical connections to the source and drain regions 204 and 206.

Using the design or techniques of the examples noted above, a device 200 may provide certain doping profile in a channel region 280 of a multi-bit flash memory, such as a twin-bit SONOS memory. In some examples, a high doping concentration is provided at or near a central portion 288 of the channel region 280, which may provide one or more of several advantages, such as inhibiting lateral charge diffusion, reducing or preventing data loss in both a program state and an erase state, reducing or preventing second-bit effect, and mitigating short channel effect.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A multi-bit memory cell, comprising:
a substrate;
a tunnel layer over the substrate;
a dielectric charge-trapping layer as a data storage layer over the tunnel layer;
an insulating layer over the dielectric charge-trapping layer;
a gate over the insulating layer having a first lateral side and a second lateral side;
a source region in the substrate, a portion of the source region being under the first lateral side of the gate;
a drain region in the substrate, a portion of the drain region being under the second lateral side of the gate; and
a channel region in the substrate between the source region and the drain region, the channel region having one of a p-type doping and an n-type doping, the doping being configured to provide a highest doping concentration near a central portion of the channel region,
wherein the dielectric charge-trapping layer has two charge-trapping regions near the source region and the drain region, respectively, and
wherein the highest doping concentration is located between the adjacent two charge-trapping regions.

2. The memory cell of claim 1, wherein the channel has at least three doped regions comprising:
a first doped region located near the central portion of the channel region;
a second doped region located near one side of the first doped region; and
a third doped region located near the other side of the first doped region, wherein the first doped region has a higher doping concentration than the second doped region and the third doped region.

3. The memory cell of claim 2, wherein the first doped region has a p-type dopant dose in the range of about $1\times10^{13}$ atoms·cm$^{-2}$ to about $1\times10^{15}$ atoms·cm$^{-2}$.

4. The memory cell of claim 2, wherein the first doped region has an n-type dopant dose in the range of about $1\times10^{13}$ atoms·cm$^{-2}$ to about $1\times10^{15}$ atoms·cm$^{-2}$.

5. The memory cell of claim 1, wherein:
the tunnel layer comprises a first silicon oxide layer;
the dielectric charge-trapping layer comprises a silicon nitride layer; and
the insulating layer comprises a second silicon oxide layer.

6. A multi-bit memory cell, comprising:
a substrate;
a multi-bit charge-trapping cell over the substrate, the multi-bit charge-trapping cell having a dielectric charge-trapping layer as a data storage layer and having a first lateral side and a second lateral side;
a source region in the substrate, a portion of the source region being under the first lateral side of the multi-bit charge-trapping cell;
a drain region in the substrate, a portion of the drain region being under the second lateral side of the multi-bit charge-trapping cell; and
a channel region in the substrate between the source region and the drain region, the channel region comprises at least three doped regions comprising:
a first doped region located near a central portion of the channel region;
a second doped region located near one side of the first doped region; and
a third doped region located near the other side of the first doped region,
wherein the first doped region having a higher doping concentration than the second doped region and the third doped region,
wherein the dielectric charge-trapping layer has two charge-trapping regions near the source region and the drain region, respectively, and
wherein the first doped region is located between the adjacent two charge-trapping regions.

7. The memory cell of claim 6, wherein the first, second, and third doped regions have one of a p-type doping and an n-type doping, and the doping is configured to provide a highest doping concentration near the central portion of the channel region.

8. The memory cell of claim 6, wherein the first doped region has an n-type dopant dose in the range of about $1\times10^{13}$ atoms·cm$^{-2}$ to about $1\times10^{15}$ atoms·cm$^{-2}$.

9. The memory cell of claim 6, wherein the first doped region has a p-type dopant dose in the range of about $1\times10^{13}$ atoms·cm$^{-2}$ to about $1\times10^{15}$ atoms·cm$^{-2}$.

10. The memory cell of claim 6, wherein the multi-bit charge-trapping cell comprises:
a tunnel layer over the substrate;
the dielectric charge-trapping layer over the tunnel layer;
an insulating layer over the dielectric charge-trapping layer; and
a gate over the insulating layer.

11. The memory cell of claim 10, wherein
the tunnel layer comprises a first silicon oxide layer;
the dielectric charge-trapping layer comprises a silicon nitride layer; and
the insulating layer comprises a second silicon oxide layer.

12. A method of forming a multi-bit memory cell, comprising:
provide a substrate;
forming a multi-bit charge-trapping cell over the substrate, the multi-bit charge-trapping cell having a dielectric charge-trapping layer as a data storage layer and having a first lateral side and a second lateral side;
forming a source region in the substrate, a portion of the source region being under the first lateral side of the multi-bit charge-trapping cell;
forming a drain region in the substrate, a portion of the drain region being under the second lateral side of the multi-bit charge-trapping cell; and
forming a channel region in the substrate between the source region and the drain region, the channel region comprises at least three doped regions comprising:
a first doped region located near a central portion of the channel region;
a second doped region located near one side of the first doped region; and
a third doped region located near the other side of the first doped region,
wherein the first doped region has a higher doping concentration than the second doped region and the third doped region,
wherein the dielectric charge-trapping layer has two charge-trapping regions near the source region and the drain region, respectively, and
wherein the first doped region is located between the adjacent two charge-trapping regions.

13. The method of claim 12, wherein the first, second, and third doped regions have one of a p-type doping and an n-type doping, and the doping is configured to provide a highest doping concentration near the central portion of the channel region.

14. The method of claim 12, wherein the first doped region has an n-type dopant dose in the range of about $1\times10^{13}$ atoms·cm$^{-2}$ to about $1\times10^{15}$ atoms·cm$^{-2}$.

15. The method of claim 12, wherein the first doped region has a p-type dopant dose in the range of about $1\times10^{13}$ atoms·cm$^{-2}$ to about $1\times10^{15}$ atoms·cm$^{-2}$.

16. The method of claim 12, wherein the multi-bit charge-trapping cell comprises:
a tunnel layer over the substrate;
the dielectric charge-trapping layer over the tunnel layer;
an insulating layer over the dielectric charge-trapping layer; and
a gate over the insulating layer.

17. The method of claim 16, wherein
the tunnel layer comprises a first silicon oxide layer;
the dielectric charge-trapping layer comprises a silicon nitride layer; and
the insulating layer comprises a second silicon oxide layer.

* * * * *